(12) United States Patent
Otsuki

(10) Patent No.: US 7,372,167 B2
(45) Date of Patent: May 13, 2008

(54) SEMICONDUCTOR DEVICE AND METHOD OF MANUFACTURING SEMICONDUCTOR DEVICE

(75) Inventor: Tetsuya Otsuki, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 50 days.

(21) Appl. No.: 11/213,788

(22) Filed: Aug. 30, 2005

(65) Prior Publication Data
US 2006/0049510 A1 Mar. 9, 2006

(30) Foreign Application Priority Data
Sep. 6, 2004 (JP) ............... 2004-258740

(51) Int. Cl.
H01L 23/48 (2006.01)
H01L 23/52 (2006.01)
H01L 23/40 (2006.01)

(52) U.S. Cl. ............... 257/779; 257/778; 257/738

(58) Field of Classification Search ............... 257/778, 257/738, 741, 750, 762, 766, 780, 772, 779; 438/613–617, 612
See application file for complete search history.

(56) References Cited

U.S. PATENT DOCUMENTS

| | | | |
|---|---|---|---|
| 5,796,163 A | 8/1998 | Glenn et al. | |
| 6,448,647 B1 * | 9/2002 | Kurita et al. | 257/738 |
| 6,762,506 B2 * | 7/2004 | Amagai et al. | 257/786 |
| 2003/0230799 A1 * | 12/2003 | Yee et al. | 257/706 |

FOREIGN PATENT DOCUMENTS

| | | |
|---|---|---|
| JP | A 10-335533 | 12/1998 |
| JP | A 10-340972 | 12/1998 |
| JP | A 2003-124264 | 4/2003 |
| JP | A 2003-332497 | 11/2003 |
| JP | A 2004-158737 | 6/2004 |

* cited by examiner

Primary Examiner—David A Zarneke
Assistant Examiner—Jenny L Wagner
(74) Attorney, Agent, or Firm—Oliff & Berridge, PLC

(57) ABSTRACT

A semiconductor device according to claim 1, wherein A method of manufacturing a semiconductor chip the carrier substrate A semiconductor device includes; a carrier substrate in which a semiconductor chip is mounted; a first land that is mounted on the carrier substrate and placed on a region which is differ from a region for mounting the semiconductor chip, and a basis metal of an junction surface of the first land is exposed; and a second land that is mounted on the carrier substrate and placed on a region which is differ from a region for mounting the semiconductor chip, and a plating layer is deposited on a junction surface of the second land.

12 Claims, 3 Drawing Sheets

SEMICONDUCTOR DEVICE AND METHOD OF MANUFACTURING SEMICONDUCTOR DEVICE

BACKGROUND OF THE INVENTION

This application claims the benefit of Japanese Patent Application No. 2004-258740, filed Sep. 6, 2004. The entire disclosure of the prior application is hereby incorporated by reference herein in its entirety.

1. Technical Field

The present invention related to a semiconductor and a method of manufacturing a semiconductor, more particularly to a method for a chip size package (CSP) and a ball grid array (BGA.)

2. Related Arts

Conventionally, a method for using CSP or BGA has been used for downsizing a semiconductor package. In these methods such as CSP and BGA, a semiconductor package is formed by using a carrier substrate on which a semiconductor chip is mounted. Here, a carrier substrate is jointed to a mother-board by using a solder ball or a lead ball, when a carrier substrate, on which a semiconductor chip is mounted, is placed on a mother-board. Then, a land is formed in a carrier substrate and a mother-board, in order to joint a solder ball or a lead ball to a carrier board and a mother-board.

Here, copper is generally used as a material for a land on the substrate 21. Then a basis metal of a land is plated with nickel and gold in order to insure the strength of a ball shear and tolerance to temperature cycle. In recent years, a semiconductor package using CSP and BGA has been mounted on a mobile phone in response to a downsized and sophisticated mobile phone device. Under the situation, in order to improve tolerance to shock when falling a device, a solder ball or a lead ball is directly jointed to a basis metal of copper without nickel- or gold-plating a land.

Further, the Japanese unexamined patent publication 10-340972 discloses a method for forming an tapered end at the opening of a solder resist layer in order to avoid a crack to a solder ball when temperature cycling.

However, when a solder ball or a lead ball is directly jointed to a base of copper, there is problem of deteriorating the shearing strength (horizontal strength), the strength of a ball shear and tolerance to temperature cycle, even if tolerance to shock is improved when falling a device. On the other hand, when gold-plating a land, there is the other problem of deteriorating tolerance to shock when falling a device because of weakness toward peeling off direction of $(Cu, Ni)_6 Sn_5$ even if assuring the shearing strength, the strength of a ball shear and tolerance to temperature cycle.

SUMMARY

The advantage of the present invention is to provide a semiconductor device and a method of manufacturing a semiconductor device, which is capable of improving tolerance to shock with constraining deterioration of shearing strength.

According to a first aspect of the present invention, a semiconductor device comprises a carrier substrate in which a semiconductor chip is mounted; a first land mounted on the carrier substrate and place on a region which is differ from a region for mounting the semiconductor chip, and a junction surface of basis metal of the first land is exposed; and a second land that is mounted on the carrier substrate and placed on a region which is differ from a region for mounting the semiconductor chip, and a plated layer is deposited on a junction surface;

Hence, jointing the first land to the first protrusion electrode enables the strength of the peeling off direction to be secured and jointing the second land to the second protrusion electrode enables the shear strength to be secured. Accordingly, it is possible to assure the strength of the peeling off direction accompanied with constraining deterioration of the shear strength, assuring the ball shear strength and tolerance to temperature cycle and improving tolerance to shock.

According to other aspect of the invention, the first land is located in a region where tensile stress is easily applied to the carrier substrate, and the second land is located in a region where shear stress is easily applied to the carrier substrate. Hence, it is possible to improve tolerance to tensile stress in a region where tensile stress is easily applied and to improve tolerance to shear stress in a region where shear stress is easily applied. Accordingly, it is possible to improve tolerance to shock with constraining deterioration of the shear strength.

Further, according to third aspect of the invention, the first land is located in a region where tensile stress is easily applied comparing to an region where the second land is placed, and the second land is located in a region where shear stress is easily applied comparing to an region where the first land is placed. Hence, it is possible to improve tolerance to tensile stress in a region where tensile stress is easily applied and to improve tolerance to shear stress in a region where shear stress is easily applied. Accordingly, it is possible to improve tolerance to shock with constraining deterioration of the shear strength.

Further, according to fourth aspect of the invention, a semiconductor device comprises a mother-board in which the carrier substrate is mounted via the first and the second protrusion electrodes. Thus, it is possible to reduce an area for mounting a semiconductor package, improving tolerance to shock and the shear strength and in response to a downsized and sophisticated mobile device such as cellular phone.

According to fifth aspect of the invention, a semiconductor device comprises a basis metal of the first and the second lands, which is Cu, the plating layer, which is one of a Pd single layer, a Au single layer, Sn single layer, a Ni/Au multi-layered structure, a Pd/Ni multi-layered structure, and Pd/Au multi-layered structure and the protrusion electrode, which is a solder ball or a lead ball. Thus, it is possible to stably joint a solder ball or a lead ball to a lead layer, assuring the shear strength of joint portion with the plating layer, directly jointing a solder ball or a lead ball to a basis metal of copper, and improving tolerance to shock when falling a product down.

According to a six aspect of the invention, a method of manufacturing a semiconductor device may further comprise; forming a first and a second lands on a carrier substrate to be placed in a region which is differ from a region for semiconductor mounting; forming a plated layer on a junction surface of the second land by plating accompanied with covering the first land by a resist; and mounting a semiconductor chip on the carrier substrate.

Thus, it is possible to selectively form a plated layer on a joint surface of the second land and joint the second protrusion electrode to the second land in which a plated layer is formed after jointing the first protrusion electrode to the surface of the basis metal of the first land. Hence, it is possible to downsize a semiconductor package, constraining the deterioration of the shear strength, improving tolerance to shock.

According to a seven aspect of the invention, a method of manufacturing a semiconductor chip further comprises; mounting the carrier substrate, in which the semiconductor chip is mounted, on the mother-board via the protrusion electrode connecting the first and the second lands. Thus, it is possible to reduce an area for mounting a semiconductor package, improving tolerance to shock and the shear strength and in response to a downsized and sophisticated mobile device such as cellular phone.

BRIEF DESCRIPTION OF THE DRAWINGS

The invention will be described with reference to the accompanying drawings, wherein like numbers refer to like elements, and wherein.

DESCRIPTION OF THE EMBODIMENTS

A method for manufacturing a semiconductor device according to an embodiment of the present invention will now be described with reference to the accompanying drawings.

Figure 1:
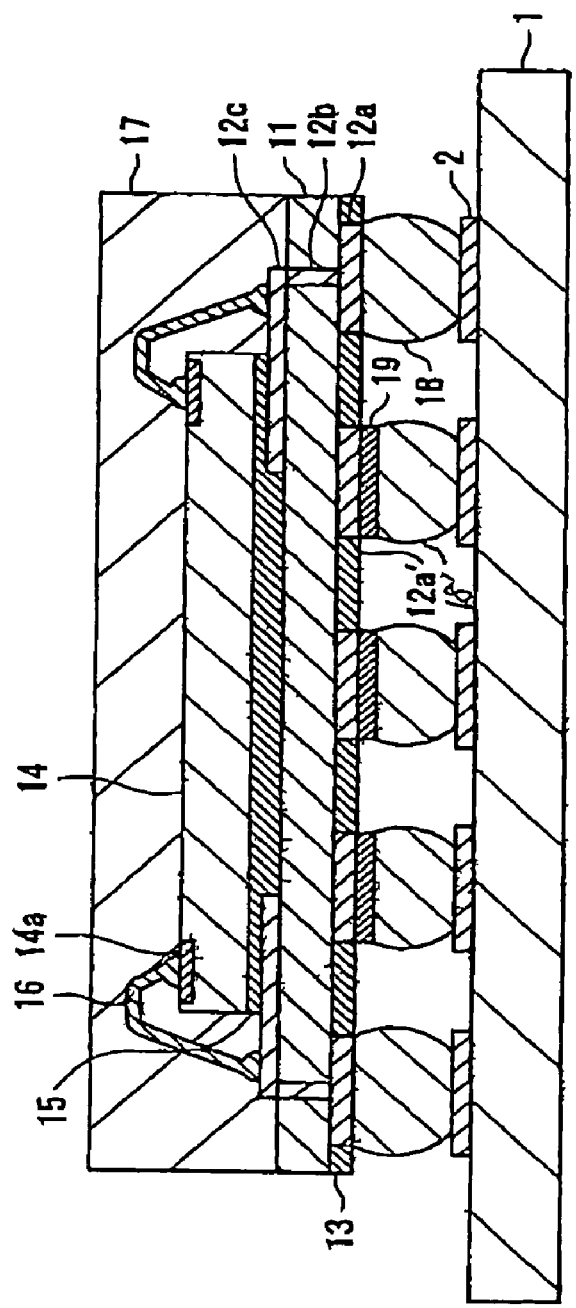
FIG. 1 is a sectional view showing a semiconductor device according to a embodiment of the invention.

FIG. 1 is a sectional view showing a method for manufacturing a semiconductor device according to a first embodiment of the invention.

In FIG. 1, a conductive pattern 12c is formed on the surface of the carrier substrate 11 and a plurality of lands 12a and 12a' are formed on the back side of the carrier substrate 11. Here, a plated layer 19 is formed on the land 12a' and a basis metal is exposed on the land 12a without forming a plated layer 19. the plated layer 19 is one of a Pd single layer, a Au single layer, Sn single layer, a Ni/Au multi-layered structure, a Pd/Ni multi-layered structure, and Pd/Au multi-layered structure.

Further, an internal wiring 12b is formed within the carrier substrate 11 and the conductive pattern 12c is coupled to the lands 12a and 12a' via an internal wiring 12b. Further, a solder resist layer 13 is formed on the carrier substrate 11, covering over the lands 12a and 12a'. A semiconductor chip 14 is mounted with face up on the carrier substrate 11 via an adhesive layer 15. Here, the semiconductor chip 14 is provided with a pad electrode 14a, which is coupled to the conductive pattern 12c via a bonding wire 16. The semiconductor chip 14 mounted on the carrier substrate is encapsulated by the sealing resin 17. Here, when the semiconductor chip 14 is sealed with the sealing resin 17, thermally cured resin such as epoxy resin is molded.

Further, protrusion electrodes 18 and 18' are formed on the lands 12a and 12a', which is formed on the backside of the carrier substrate, in order to mount the carrier substrate 11 on the mother-board 1. Then, the carrier substrate 11 is mounted on the mother-board 1 by jointing protrusion electrodes 18 and 18' to the land 2 formed on the mother-board 1. Here, as the carrier substrate 11, any of a double faced substrate, a multi-wired substrate, a built-up substrate, a tape substrate, or a film substrate are used. As a material fro the carrier substrate 11, one of the carrier substrate 11, polyimide resin, glass epoxy resin, BT resin, composite of aramide with epoxy and ceramic is used. As a material for the conductive pattern 12c and the lands 2, 12a and 12a', copper is used for example. As the protrusion electrode 18, any one of a solder ball, a lead ball, a Au bump, Cu bump and Ni bump covered with solder is used. As a bonding wire 16, Au wire or Al wire is used. As an adhesive layer 15, Ag paste is used for example. As lead free ball, an alloy of SN—Ag—Cu or Sn—Ag—Bi can be used.

Further, the semiconductor chip 14 is mounted with face up on the carrier substrate 11. Otherwise, the chip 14 may be mounted with flip chip on the carrier substrate 11. When the semiconductor chip 14 is mounted with flip chip on the carrier substrate 11, jointing them can be preformed by using anisotropic conductive film (ACF), nonconductive film (NCF) anisotropic conductive paste(ACP) and non conductive paste (NCP). Otherwise, metal junction such as solder joint and alloy joint may be used.

Jointing the protrusion electrodes 18 and 18' to the lands 12a and 12a' can joint the protrusion electrode 18' to the land 12a' in which the plated layer 19 is formed after directly jointing the protrusion electrode 18 to a basis metal of the land 12a. Here, Using copper as a basis metal for the land 12a, can improve the strength for peeling off direction and tolerance to shock, comparing to applying the plated layer 19 such as a Ni/Au layer to the land 12a. Further, forming the plated layer 19 on the land 12a' improves the shear strength comparing to a case without a plated layer 19. Hence, jointing the land 12a to the protrusion electrode 18 enables the strength of the peeling off direction to be secured and jointing the land 12a' to the protrusion electrode 18' enables the shear strength to be secured. Accordingly, it is possible to assure the strength of the peeling off direction accompanied with constraining deterioration of the shear strength, assuring the ball shear strength and tolerance to temperature cycle and improving tolerance to shock.

Here, when a solder ball or a lead ball is jointed to the basis metal Cu of the land 12a, an organic film such as CuOSP is applied to the land 12a. Further, when the protrusion electrode 18 is coupled to the land 12 formed on the motherboard 1, the protrusion electrode 18 is directly coupled to the basis metal of the land 2. Otherwise, the land 2 formed on the mother-board 1 can be split into two lands such as one land with plating and the other land without plating.

Further, the land 12a may be located in a region where tensile stress is easily applied to the carrier substrate 11, and the land 12a' may be located in a region where shear stress is easily applied to the carrier substrate 11. Particularly, it is further favorable that the land 12a may be located in a region where tensile stress is easily applied compared to a region where the land 12a' is placed, and the land 12a' may be located in a region where shear stress is easily applied comparing to an region where the land 12a is placed.

Figure 2:
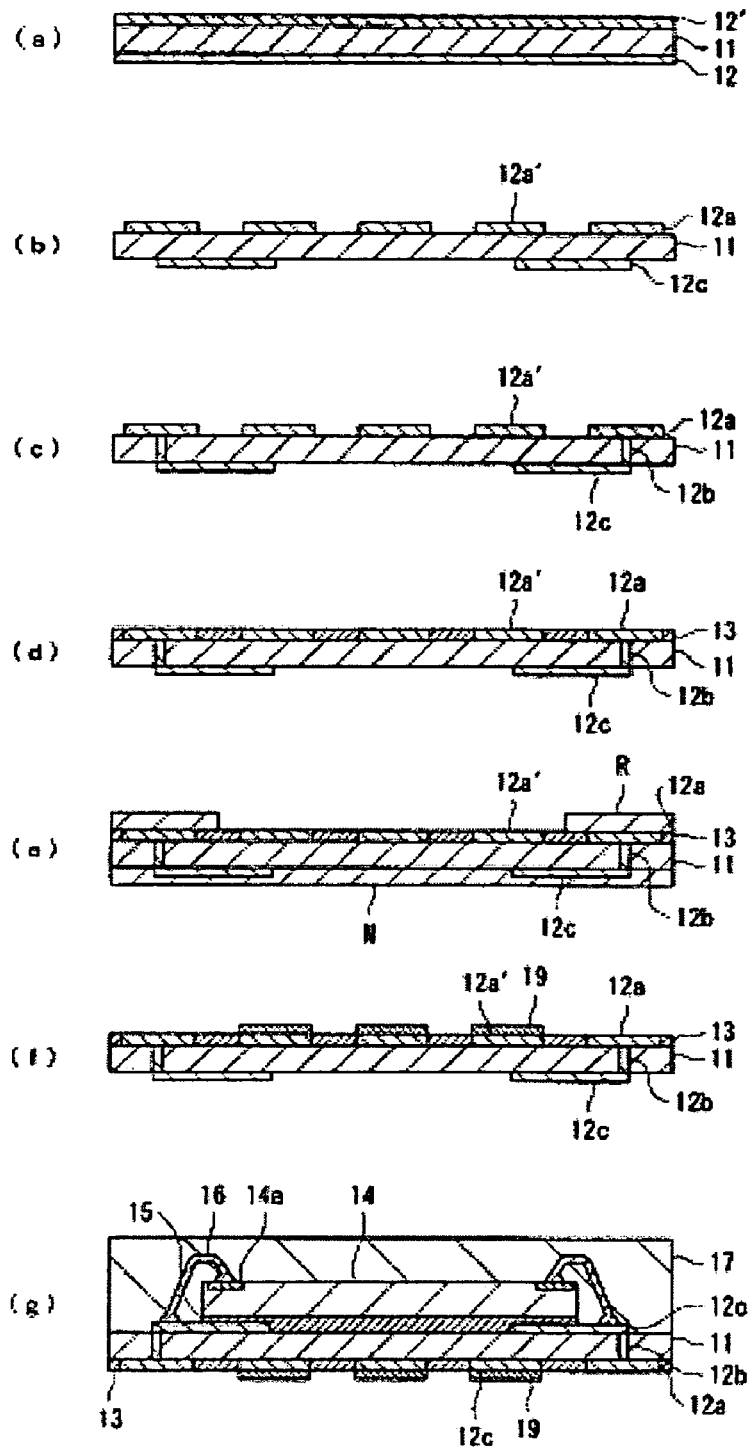
FIG. 2 is a sectional view showing a method of manufacturing a semiconductor device according to the embodiment of the invention.

FIGS. 2A to 2G are sectional views showing a method for manufacturing a semiconductor device according to a first embodiment of the invention. FIG. 2A shows copper films 12 and 12' attached to the both faces of the carrier substrate 11. Then, as shown in FIG. 2B, copper films 12 and 12' are patterned to form a conductive pattern 12c on one surface of the carrier substrate 11 and the lands 12a and 12a' on the back surface of the carrier substrate 11.

Here, the conductive pattern 12c is formed on the carrier substrate 11 by a photolithography, in which a first photo resist corresponding to the shape of the conductive pattern 12c is formed on the copper film 12. Then, the conductive pattern 12c is formed on the carrier substrate 11 by etching the copper film 12 with using the first photo resist as a mask. Here, the lands 12a and 12a' are formed on the back face of the carrier substrate 11 by a photolithography, in which a second photo resist corresponding to the shape of the lands 12a and 12a' is formed on the copper film 12'. Then, the lands 12a and 12a' are formed on the back face of the carrier substrate 11 by etching the copper film 12' with using the second photo resist as a mask.

Here, a plated layer comprising a Ni/Au multi-layered structure may be formed on the conductive pattern 12c. The thickness of the land 12a is around 10 to 30 μm and the radius of the land 12a is around 300 to 400 μm for example.

Next, as shown in FIG. 2C, the opening penetrating the carrier substrate 11 is formed and conductive material is embedded into the opening, forming the internal wiring 12b in the carrier substrate 11. Here, Cu paste is used as a conductive material, which is embedded within the opening.

Next, as shown in FIG. 2D, the solder resist layer 13 is formed on the carrier substrate 11 covering over the circumference of the land 12a. Here, an insulating resin is coated over the carrier substrate 1 via a mask covering over the land 12a and 12a' to form the solder resist layer 13 on the carrier substrate 11. Further, as shown in FIG. 2E, a masking tape M covering over the conductive pattern 12c is attached to the carrier substrate 11. By using a photo lithography, a resist pattern R is formed on a back surface of the carrier substrate 11, covering over the junction surface of the land 12a and exposing the junction surface of the land 12a'. Then, plating the carrier substrate 11 covered by the resist pattern R selectively forms the plated layer 10 on the land 12a' as shown in FIG. 2F. Here, plating the carrier substrate 11 may be performed without attaching a masking tape to the carrier substrate 11, when a plated layer is formed on the conductive pattern 12c. Then, the plated layer 19 is selectively formed on the land 12a', and the resist pattern P and the masking tape M are removed from the carrier substrate 11.

Next, as shown in FIG. 2G, the semiconductor chip 14 is mounted on the carrier substrate 11 via the adhesive layer 15. Then, the pad electrode 14a is coupled to the conductive pattern 12c via the bonding wire 16 and the semiconductor chip 14 is sealed by a sealing resin 17. Then, as shown in FIG. 1 the protrusion electrode 18 is connected to the lands 2 and 12a and the protrusion electrode 18' is connected to the lands 2 and 12a'. Hence, the carrier substrate 11 is mounted on the mother-board 1.

FIGS. 3A to 3D are plane views of ways of locating lands in which a plated layer is formed with respect to the embodiment.

Figure 3:
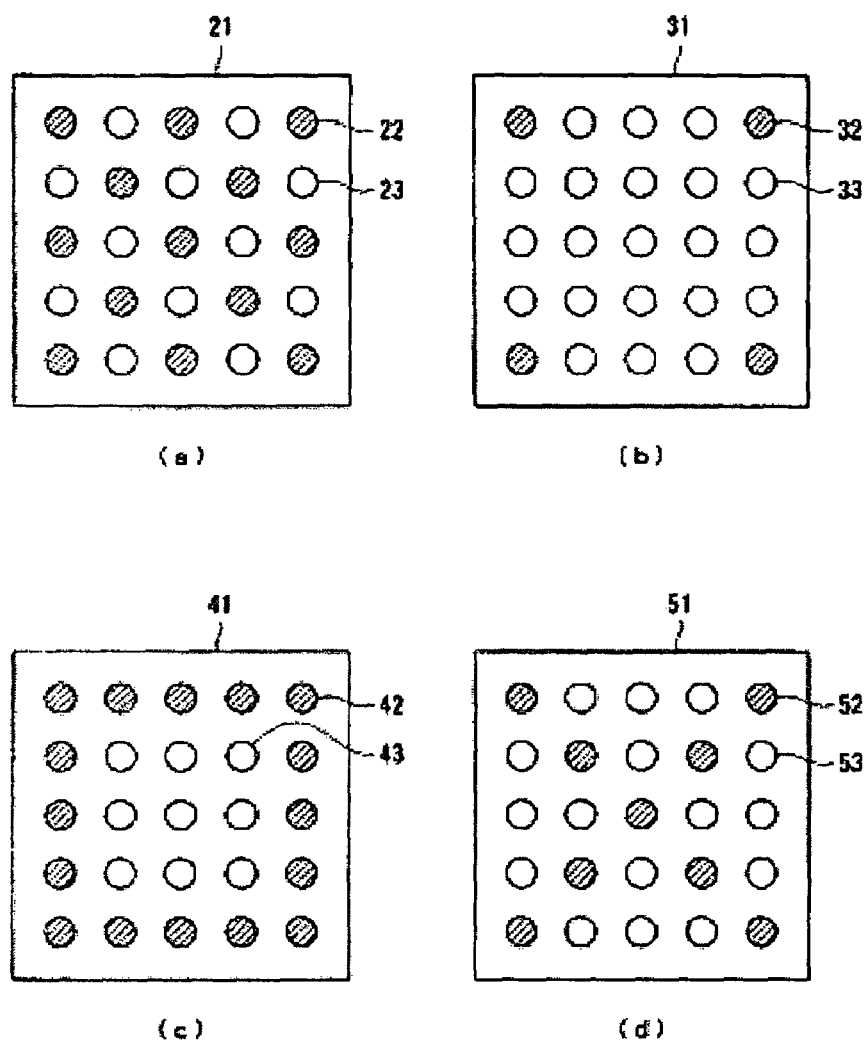
FIG. 3 is a plane view of a way of arranging a land in which a plated layer is formed.

In FIG. 3A, the land 22, in which a basis metal is exposed, and the land 23, in which junction surface is plated, are arranged alternatively. Thus, it is possible to surround the land 22, which is inferior in the shearing strength, by the land 23 which is superior in the shearing strength, and also possible to surround the land 23, which is inferior in the strength toward peeling off direction, by the land 22 which is superior in the strength toward peeling off direction. As the result, it is possible to support the junction of the land 22, which is inferior in the shearing strength, by the junction of the land 2w, which is superior in the shearing strength and also possible to surround junction of the land 23, which is inferior in the strength toward peeling off direction, by junction of the land 22 which is superior in the strength toward peeling off direction. Hence, this arrangement enables a semiconductor package to be downsized, constrains the deterioration of the shearing stress and improves tolerance to shock.

Here, as shown in FIG. 3B, the plated land 33 may be located on the carrier substrate 31 and the land 32, in which a basis metal is exposed, may be located in the corner of the corner substrate 31.

Here, as shown in FIG. 3C, the plated land 43 may be located in the inside of the carrier substrate 41 and the land 42, in which a basis metal is exposed, may be located in outer circumstances of the carrier substrate 41.

Further, as shown in FIG. 3D, the plated land 53 may be located on the carrier substrate 51 and the land 52, in which a basis metal is exposed, may be located on the diagonal of the carrier substrate 51.

What is claimed is:

1. A semiconductor device, comprising;
   a carrier substrate;
   a semiconductor chip that is mounted above a first surface of the carrier substrate;
   a plurality of first lands that are mounted on a second surface of the carrier substrate opposite to the first surface of the carrier substrate, the plurality of first lands being electrically connected to the semiconductor chip, base metals of junction surfaces of the plurality of first lands being exposed; and
   a second land that is mounted on the second surface of the carrier substrate, the second land being electrically connected to the semiconductor chip, a plating layer being deposited on a junction surface of the second land, the second land being surrounded on four sides by the plurality of first lands.

2. The semiconductor device according to claim 1,
   the plurality of first lands being located in regions where the carrier substrate has a high probability of being subjected to tensile stress, and
   the second land being located in a region where the carrier substrate has a high probability of being subjected to shear stress.

3. The semiconductor device according to claim 1,
   the plurality of first lands being located in regions where tensile stress is more likely to be applied compared to a region where the second land is placed, and
   the second land being located in a region where shear stress is more likely to be applied compared to regions where the first lands are placed.

4. The semiconductor device according to claim 1,
   a first tensile stress at first regions where the plurality of first lands are located being higher than a second tensile stress at a second region where the second land is located,
   a first shear stress at the second region being higher than a second shear stress at the first regions.

5. The semiconductor device according to claim 4,
   a base metal of the first lands being Cu, and
   the plated layer being any one of a Pd single layer, a Au single layer, Sn single layer, a Ni/Au multi-layered structure, a Pd/Ni multi-layered structure, and a Pd/Au multi-layered structure and the protrusion electrode is a solder ball or a lead ball.

6. A method of manufacturing a semiconductor device, comprising:
   forming a plurality of first lands and a second land on a first surface of a carrier substrate such that the second land is surrounded on all four sides by the plurality of first lands;
   forming a plated layer on a junction surface of the second land by plating accompanied with covering the first lands by a resist; and mounting a semiconductor chip above a second surface of the carrier substrate so that the semiconductor chip is electrically connected to the first lands-and the second land, the second surface of the carrier substrate being opposite to the first surface of the carrier substrate.

7. The method of manufacturing a semiconductor device according to claim 6, further comprising:
mounting the carrier substrate, above which the semiconductor chip is mounted, on the mother-board via a plurality of first protrusion electrodes and a second protrusion electrode, each of the first protrusion electrodes being connected to each of the plurality of first lands, the second protrusion electrode being connected to the second land.

8. The semiconductor device according to claim 1, further comprising:
a plurality of first protrusion electrodes each of the plurality of first protrusion electrodes being connected to each of the first lands;
a second protrusion electrode that is connected to the second land; and
a mother-board, above which the carrier substrate is mounted via the plurality of first protrusion electrodes and the second protrusion electrode.

9. The semiconductor device according to claim 1, further comprising:
a plurality of the second lands, each of the plurality of the second lands being surrounded on four sides by the plurality of first lands.

10. The semiconductor device according to claim 9, one of the plurality of first lands being surrounded on four sides by the plurality of the second lands.

11. A semiconductor device, comprising:
a carrier substrate;
a semiconductor chip that is mounted above a first surface of the carrier substrate;
a plurality of first lands that are mounted on a second surface of the carrier substrate opposite to the first surface of the carrier substrate, the plurality of first lands being electrically connected to the semiconductor chip, base metals of junction surfaces of the plurality of first lands being exposed; and
a plurality of second lands that are mounted on the second surface of the carrier substrate, the plurality of second lands being electrically connected to the semiconductor chip, a plating layer being deposited on each of junctions of the plurality of the second lands, the plurality of second lands being surrounded on four sides by the plurality of first lands.

12. A method of manufacturing a semiconductor device, comprising:
forming a plurality of first lands and a plurality of second lands on a first surface of a carrier substrate such that the plurality of second lands are surrounded on four sides by the plurality of first lands;
forming a plated layer on each of junction surfaces of the plurality of second lands by plating accompanied with covering the plurality of first lands by a resist; and
mounting a semiconductor chip above a second surface of the carrier substrate so that the semiconductor chip is electrically connected to the first lands and the second lands, the second surface of the carrier substrate being opposite to the first surface of the carrier substrate.

* * * * *